US 6,573,115 B2

United States Patent
Kwak et al.

(10) Patent No.: US 6,573,115 B2
(45) Date of Patent: Jun. 3, 2003

(54) FABRICATION METHOD OF LIQUID CRYSTAL DISPLAY DEVICE FOR AN ATTACHMENT PROCESS

(75) Inventors: Dong-Yeung Kwak, Daegu (KR); Yu-Ho Jung, Gyeongsangbuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/024,283

(22) Filed: Dec. 21, 2001

(65) Prior Publication Data

US 2002/0094592 A1 Jul. 18, 2002

(30) Foreign Application Priority Data

Dec. 26, 2000 (KR) .......................................... 2000-81493

(51) Int. Cl.[7] .............................................. H01L 21/00
(52) U.S. Cl. .......................... 438/30; 438/22; 438/149; 349/106; 349/153; 349/154; 349/189

(58) Field of Search .............................. 438/22, 30, 149; 349/106, 153, 154, 189

(56) References Cited

U.S. PATENT DOCUMENTS 6,456,355 B1 * 9/2002 Choi et al.
6,501,521 B2 * 12/2002 Matsushita et al.

* cited by examiner

*Primary Examiner*—Long Pham
(74) *Attorney, Agent, or Firm*—McKenna Long & Aldridge LLP

(57) ABSTRACT

A method of fabricating a liquid crystal display device includes preparing upper and lower substrates, forming an array pattern of thin film transistors on the lower substrate, and depositing a thin film layer on the entire lower substrate except for four corners by using a shadow mask. A seal pattern is formed on the lower substrate and an attachment resin is formed at each of the four corners of the lower substrate. A color filter and a black matrix are formed on the upper substrate. The upper and lower substrates are attached and the attachment resin is hardened by exposure to light.

21 Claims, 8 Drawing Sheets

FABRICATION METHOD OF LIQUID CRYSTAL DISPLAY DEVICE FOR AN ATTACHMENT PROCESS

This application claims the benefit of Korean Patent Application No. 2000-81493, filed on Dec. 26, 2000, which is hereby incorporated by reference as if fully set forth herein.

BACKGROUND OF THE INVENTION

1. Field of the Invention

The present invention relates to a fabrication method of a liquid crystal display device, and more particularly to a method of temporarily fixing an attachment state of upper and lower substrates before a hot press process for hardening.

2. Discussion of the Related Art

Generally, liquid crystal display (LCD) devices include upper and lower substrates, where color filters and thin film transistors (TFTs) are disposed. A liquid crystal layer is interposed between the upper substrate and the lower substrate. Transmittance of the LCD devices is controlled by applying a voltage to common electrodes and pixel electrodes so that characters and images are displayed with a light shutter effect.

A fabrication process of a liquid crystal cell will be explained briefly.

After the upper and lower substrates are aligned and attached so that the surfaces of the common electrodes and pixel electrodes face each other, the liquid crystal material is injected between the substrates and an injection hole is sealed. Polarizers are then attached on each outer surface of the upper and lower substrates.

The fabrication process of the liquid crystal cell seldom includes repeated steps compared with the fabrication processes of the TFT and the color filter. The process includes forming an orientation film, forming a cell gap and cutting the cell.

FIG. 1 is a flow chart illustrating a conventional fabrication process of a liquid crystal cell.

At step ST1, a lower substrate is prepared by forming an array of TFTs and pixel electrodes on the lower substrate.

At step ST2, an orientation film is formed on the lower substrate. Formation of the orientation film includes depositing a polymeric thin film and subsequently performing a uniform rubbing process. The rubbing process determines an initial alignment direction and supplies the normal operation of the liquid crystal layer and the uniform display characteristic of the LCD device. Typically, an organic material of the polyimide series is used as the orientation film. The rubbing method includes rubbing the orientation film along the specific direction with a rubbing cloth, thereby aligning the liquid crystal molecules along the rubbing direction.

At step ST3, a seal pattern is formed on the lower substrate. In the liquid crystal cell, the seal pattern serves two functions: forming a gap for liquid crystal material injection and confining the injected liquid crystal material. The seal patterning process forms a desired pattern by application of a thermosetting plastic. A screen-printing method using a screen mask is typically used for this process.

At step ST4, a spacer is sprayed on the lower substrate. The size of the spacer used in the liquid crystal cell maintains a precise and uniform gap between the upper and lower substrates. Accordingly, the spacers are uniformly sprayed on the lower substrate.

At step ST5, the upper and lower substrates are aligned and attached. The alignment margin between the upper and lower substrates is determined by the device design, and accuracy within a few micrometers is generally required. If the alignment margin is exceeded, the liquid crystal cell will not operate adequately due to light leakage.

At step ST6, the attached liquid crystal substrate is divided into unit cells. Generally, a plurality of unit cells are formed on a large sized glass substrate and then divided through a cutting process. In the fabrication process of the initial LCD devices, the unit cells are separated after simultaneous injection of the liquid crystal material into the unit cells. However, injection of liquid crystal material is commonly performed after a large sized liquid crystal substrate is cut into unit cells due to an increase of the cell size. The cell cutting process includes a scribe process that forms cutting lines on a surface of the substrate using a diamond pen, a hardness of which is higher than that of the glass substrate, and a break process that divides the substrate by force.

At step ST7, a liquid crystal material is injected into the unit cells. The unit cell has a size of several hundred square centimeters with a gap of several micrometers. Accordingly, a vacuum injection method using pressure difference between the interior and exterior of the unit cell is commonly used as an effective injection method.

In the previous process, the seal pattern is hardened under high temperature and the upper and lower substrates are not firmly attached before hardening. Therefore, temporarily fixing the substrates before a hot press process for hardening is required. Means to support the upper and lower substrates (for convenience, called as a fixing means) with a specific shape are formed at all four corners of the lower substrate between the seal patterning and attachment processes. Light curable resin can be used as the fixing means.

However, during the fabrication process of the LCD device, a residual photoresist remains at the four corners so that residual thin film layers can also remain at the four corners. Since the light curable resin is located on the residual thin film layers, the light is partially screened by the residual thin film layers and the light curable resin is not hardened completely so that a misalignment of the upper and lower substrates can occur in the hot press process.

SUMMARY OF THE INVENTION

Accordingly, the present invention is directed to a liquid crystal display device and manufacturing method thereof that substantially obviates one or more of problems due to limitations and disadvantages of the related art.

An advantage of the present invention is to provide a liquid crystal display device and a manufacturing method thereof that can prevent a drawback of attachment in a hardening process.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a liquid crystal display device includes preparing upper and lower substrates; forming an array pattern of thin film transistors on the lower substrate; depositing a thin film layer on the entire lower substrate except for four corners by using a shadow mask; forming a seal pattern on the lower substrate; forming an attachment resin at each of the four corners of the lower substrate, forming a color filter and a black matrix on the upper substrate; attaching the upper and lower substrates and hardening the attachment resin by exposing the resin to light.

In another aspect, a method of fabricating a liquid crystal display device includes preparing upper and lower substrates; forming an array pattern of thin film transistors on the lower substrate; forming a seal pattern on the lower substrate; forming an attachment resin at each of the four corners of the lower substrate; forming a color filter and a black matrix on the upper substrate except for the four corners; attaching the upper and lower substrates; and hardening the attachment resin by exposing the resin to light, wherein the light is irradiated from an outer side of the attached upper and lower substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the embodiments of the present invention, examples of which are illustrated in the accompanying drawings.

Figure 1:
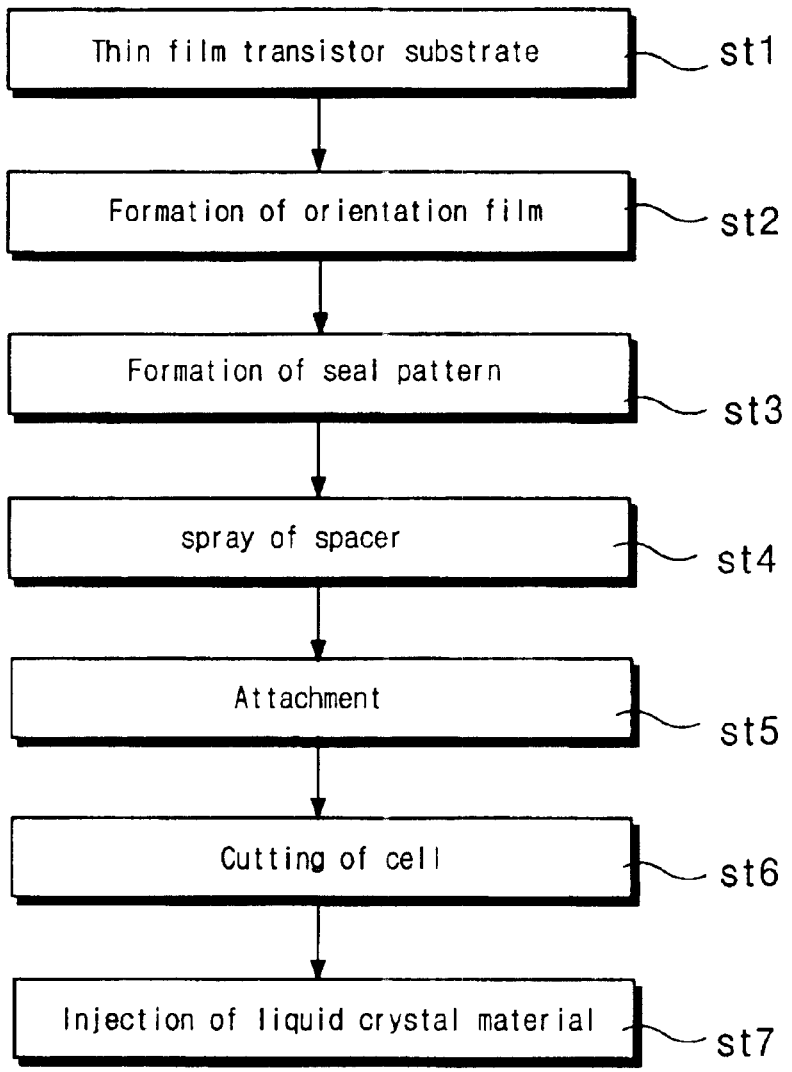
FIG. 1 is a flow chart illustrating a conventional fabrication process of a liquid crystal cell.
Figure 2:
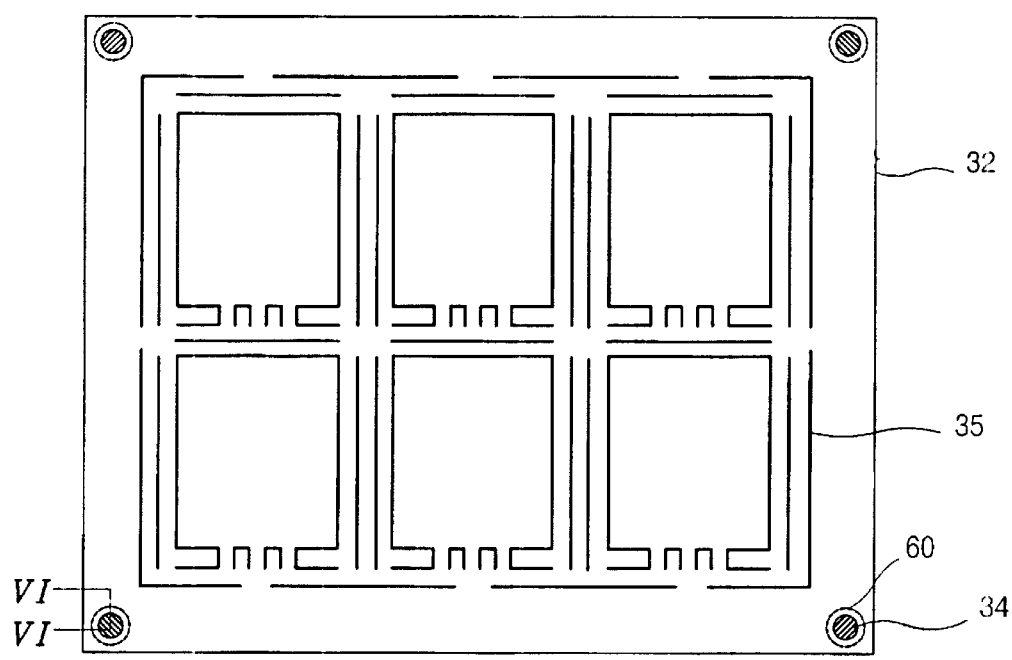
FIG. 2 is a schematic plan view of an attached liquid crystal substrate having a fixing means.

FIG. 2 is a schematic plan view of an attached liquid crystal substrate having a fixing means.

As shown, a sealant 35 is patterned on the entire substrate 32 and a fixing means 34 is formed at each of the four corners. The fixing means 34 is made of light curable resin (attachment resin), which is hardened by exposure of ultraviolet (UV) rays at room temperature. Since the UV rays cannot penetrate thin films of opaque materials such as amorphous silicon, chromium or aluminum, an attachment hole 60 for UV rays penetration is formed. Furthermore, an additional process of UV rays exposure for hardening the fixing means 34 is required.

Figure 3:
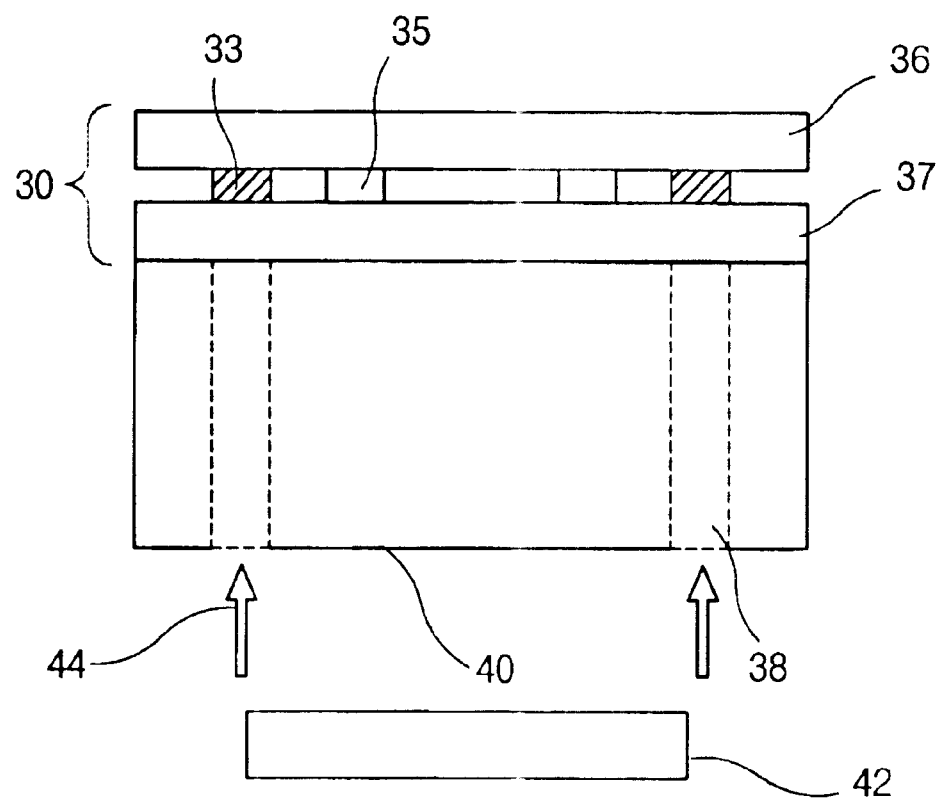
FIG. 3 is a schematic cross-sectional view showing a process of light exposure onto an attached liquid crystal substrate for hardening a fixing means.

FIG. 3 is a schematic cross-sectional view showing a process of light exposure onto each of the four corners of the attached liquid crystal substrate for hardening a fixing means.

An attachment resin 33 is used as the fixing means between the upper and lower substrates 36 and 37 of the attached liquid crystal substrate 30. A screen frame 40 having a penetration hole 38 is formed under the liquid crystal substrate 30 attached by a sealant 35 and the attachment resin 33. A light source 42 is disposed under the screen frame 40. The penetration hole 38 of the screen frame 40 is disposed to correspond with the attachment resin 33 of a specific shape. UV rays 44 are exposed through the penetration hole 38 to a light curable resin 33, which is in a viscous gel state. Accordingly, the light curable resin 33 of gel state is hardened by UV rays and becomes the fixing means 34 to attach the upper and lower substrates 36 and 37 securely.

Since the UV rays exposure for hardening the fixing means is performed under the liquid crystal substrate 30, materials that screen UV rays should not remain in a region of the fixing means 34. Therefore, in the conventional process, an additional etch process that exposes the lower substrate in a region of the fixing means has been performed after all the processes of thin film formation. However, since a deposition method and simultaneous etching of several thin films is commonly used in a four mask process, a residual thin film often exists on the four corners due to etch errors.

Figure 4:
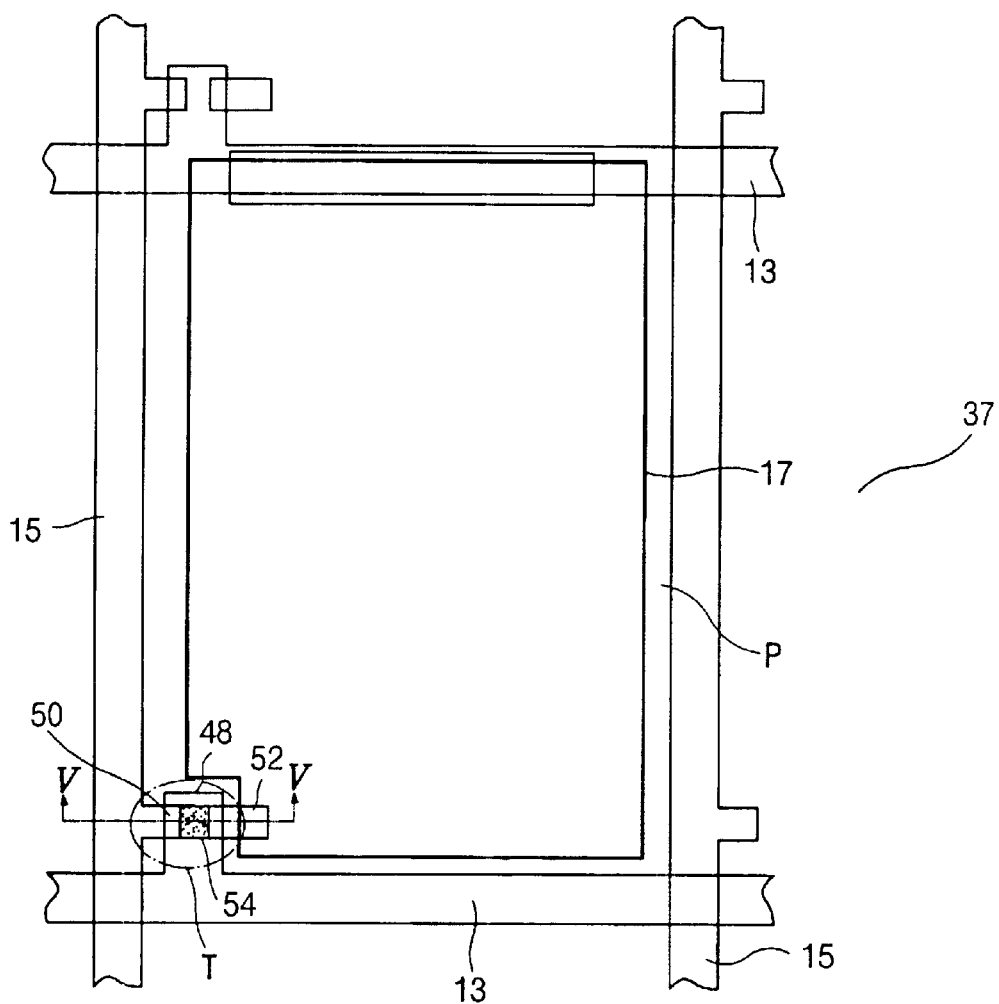
FIG. 4 is a schematic plan view showing a partial lower substrate formed by a four mask process.

FIG. 4 is a schematic plan view showing a partial lower substrate formed by a four mask process.

As shown, on the lower substrate 37, a plurality of gate lines 13 are elongated along a row direction and a plurality of data lines 15 are elongated substantially perpendicular to the gate lines 13. A thin film transistor "T" having a gate electrode 48, source electrode 50, drain electrode 52, and an active layer 54, is disposed at an edge of a pixel region "P" defined by the gate and data lines 13 and 15. The drain electrode 52 is connected to a pixel electrode 17 and transmits display signals from the data line 15 to the pixel electrode 17.

Figure 5A:
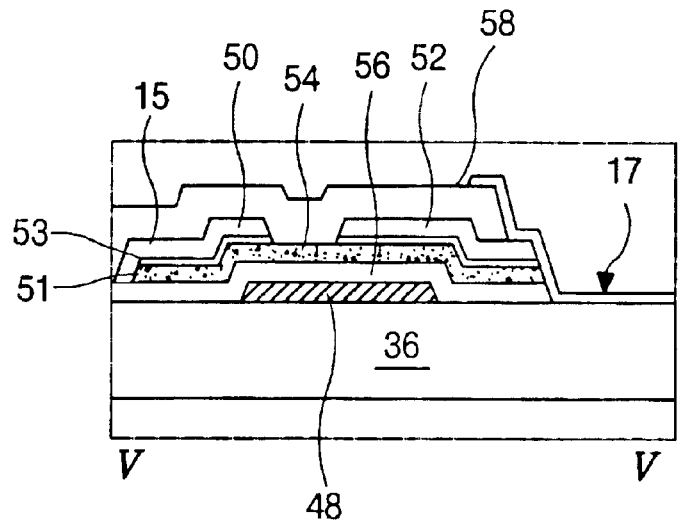
FIGS. 5A and 5B are schematic cross-sectional views taken along V—V of FIG. 4 and VI—VI of FIG. 2, respectively.
Figure 5B:
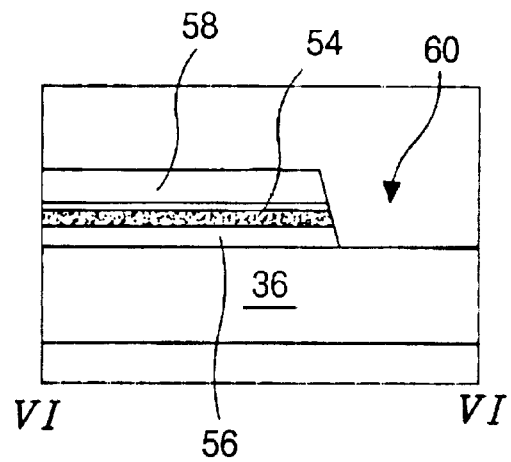

FIGS. 5A and 5B are cross-sectional views taken along V—V of FIG. 4 and VI—VI of FIG. 2, respectively.

In a first mask process, a gate line 13 (of FIG. 4) and a gate electrode 48 are formed by depositing and patterning a first metal layer on the lower substrate 36. Then, a first insulator 56, an intrinsic amorphous silicon layer 51 and a doped amorphous silicon layer 53, and a second metal layer are subsequently deposited on the entire surface of the lower substrate 36 having the gate electrode 48.

In a second mask process, a data line 15 (of FIG. 4) substantially perpendicular to the gate line 13 (of FIG. 4), a source electrode 50 protruded from the data line and a drain electrode 52 spaced apart from the source electrode 50 are formed by patterning the second metal layer and the doped amorphous silicon layer. An active channel 54 is defined by exposing the intrinsic amorphous silicon layer between the source and drain electrodes 50 and 52. Then, a second insulator 58, which is commonly made of an organic material, is deposited on the entire surface of the lower substrate 36 having the second metal layer pattern.

In a third mask process, a portion of a glass substrate surface corresponding to a pixel region "P" is exposed by simultaneously etching the second insulator 58, the second metal layer at an edge of the data line and source and drain electrodes, the intrinsic amorphous silicon layer and the first insulator 56. During this process, an attachment hole 60 exposing the lower substrate 36 is formed by etching four corners of the lower substrate 36. Then, a transparent conductive metal layer is deposited on the entire surface of the lower substrate 36.

In a forth mask process, a pixel electrode 17 connected to the drain electrode 52 is formed.

Figure 6:
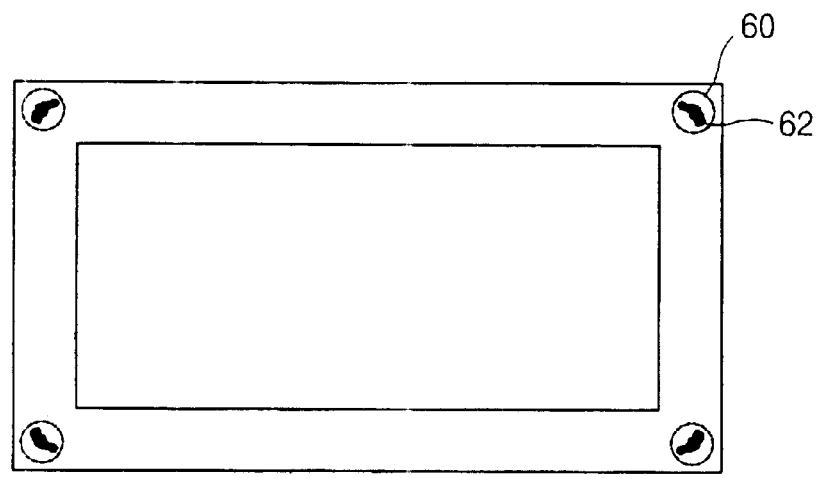
FIG. 6 is a schematic plan view of a lower substrate having residual thin film layers at the corners after patterning.

FIG. 6 is a schematic plan view of the lower substrate having residual thin film layers at the corners after patterning.

During the third mask process, four layers of the second insulator, the second metal layer, the intrinsic amorphous silicon layer and the first insulator are simultaneously etched by a dry etching method in which a residual photoresist (PR) and lower layers at a region of attachment hole 60 are etched at the same rate to have the same etch time as four layers. Since the thickness of PR formed on the array lines is different from the thickness of PR formed on the corners of the substrate, residual thin film layers 62 remain at the attachment hole 60 after the dry etch.

Figure 7:
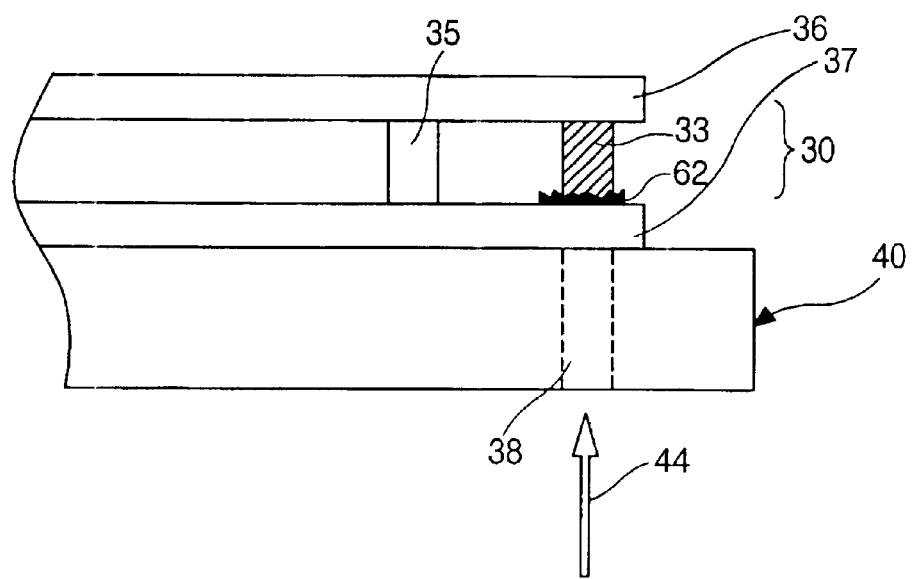
FIG. 7 is a schematic cross-sectional view of a partially attached liquid crystal substrate showing a light exposure process.

FIG. 7 is a schematic cross-sectional view of the partial liquid crystal substrate showing the light exposure process.

Since the light curable resin 33 is located on the residual thin film layers 62, the UV rays 44 exposed through the penetration hole 38 of the screen frame 40 are partially screened by the residual thin film layers 62. Accordingly, the light curable resin 33 is not hardened completely so that a misalignment of the upper and lower substrates 36 and 37 occurs in the hot press process for hardening the sealant 35.

To solve these problems, two embodiments according to the present invention are suggested.

In a first embodiment according to the present invention, the thin film deposition process of the lower substrate is performed using a shadow mask screening a region of the fixing means so that the thin film layers are not deposited on the region of the fixing means.

Figure 8:
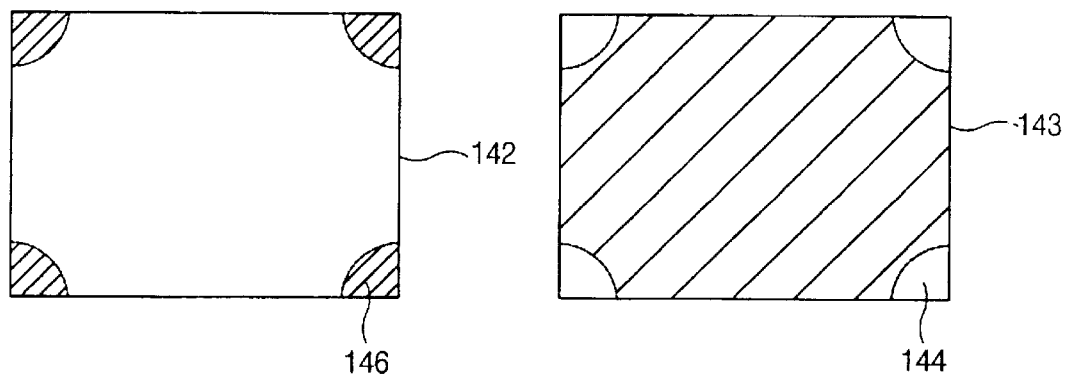
FIG. 8 is a schematic plan view of a shadow mask and a lower substrate having thin film layers deposited through the shadow mask according to a first embodiment of the present invention.

FIG. 8 is a schematic plan view of a shadow mask and a lower substrate having thin film layers deposited through the shadow mask according to a first embodiment of the present invention.

Figure 9:
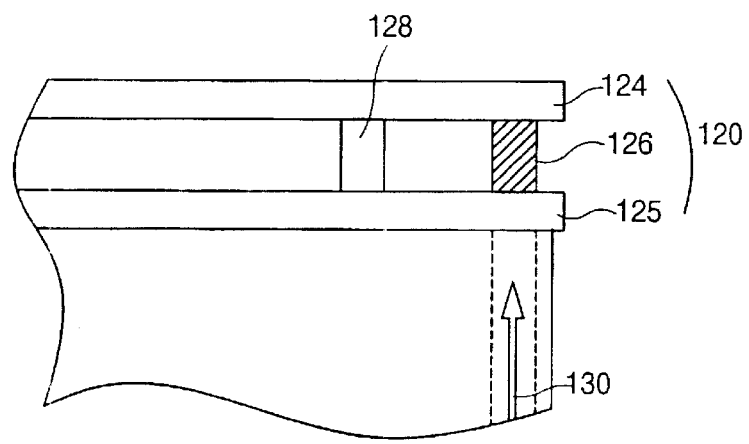
FIG. 9 is a schematic cross-sectional view of a partially attached liquid crystal substrate showing a light exposure process according to a first embodiment of the present invention.

When thin film layers are deposited on the lower substrate 143, a shadow mask 142 is aligned to the lower substrate 143. Since the shadow mask 142 has screening regions 146 corresponding to the corners of the lower substrate 143, thin film layers are deposited on the lower substrate 143 except for the corners 146. Therefore, the thin film layers are intrinsically not formed at attachment regions 144 defined by the corners of the lower substrate 143 without an additional etch process FIG. 9 is a schematic cross-sectional view of a partially attached liquid crystal substrate showing a light exposure process according to a first embodiment of the present invention.

Since an attachment resin 126 disposed between the upper and lower substrates 124 and 125 of the attached liquid crystal substrate 120 is hardened by UV rays 130, an alignment between the upper and lower substrates 124 and 125 can be firmly kept during a later hot press process for hardening a sealant 128 at high temperature.

In a second embodiment according to the present invention, UV rays are irradiated from the upper side of the attached liquid crystal substrate to prevent the underhardening of an attachment resin.

Figure 10:
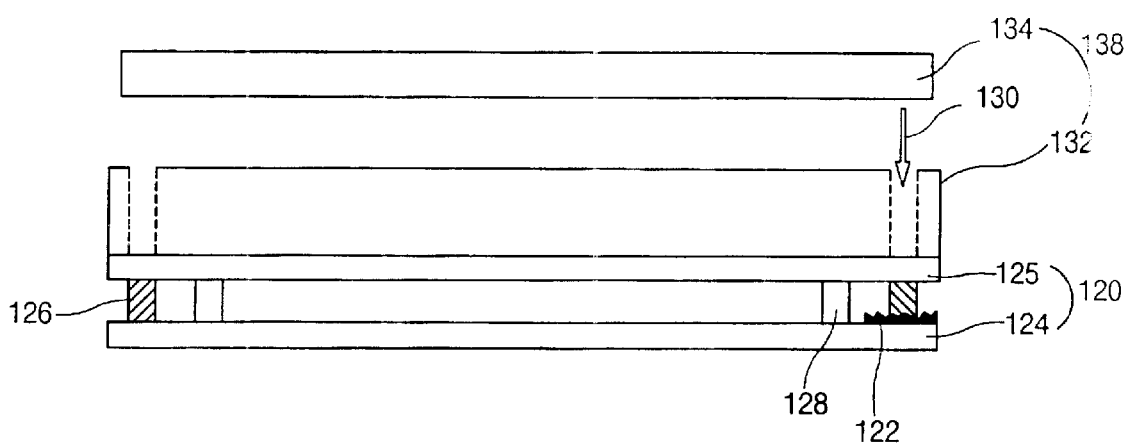
FIG. 10 is a schematic plan view of an attached liquid crystal substrate showing a light exposure process according to a second embodiment of the present invention.

FIG. 10 is a schematic plan view of an attached liquid crystal substrate showing a light exposure process according to a second embodiment of the present invention.

After a sealant 128 is printed on the lower substrate 124 and a viscous attachment resin 126 is dispensed at each of the four corners of the lower substrate 124, the upper and lower substrates 124 and 125 are attached. Before the hot press process of the attached liquid crystal substrate 120 is performed, a hardening process for the attachment resin 126 is performed at room temperature. In this process, an UV rays exposure apparatus 138 for hardening the attachment resin 126 is disposed over the attached liquid crystal substrate 120 and UV rays 130 are irradiated through a penetration hole 136 of a screen frame 132 from a light source 134. Therefore, the attachment resin 126 can be completely hardened regardless of a residual thin film 122 at an attachment region defined by the attachment resin 126.

Consequently, since the misalignment between the upper and lower substrates during the hot press process is prevented, the yield can be improved.

It will be apparent to those skilled in the art that various modifications and variation can be made in the method of manufacturing a flat pane display device of the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:

preparing upper and lower substrates;

forming a plurality of thin film layers on the entire lower substrate except for four corners by using a shadow mask;

forming a seal pattern on the plurality of thin film layers;

forming an attachment resin at each of the four corners of the lower substrate;

attaching the upper and lower substrates; and hardening the attachment resin with light after the attachment of the upper and lower substrates.

2. The method of fabricating a liquid crystal display device according to claim 1, wherein the attachment resin is a light curable resin.

3. The method of fabricating a liquid crystal display device according to claim 1, wherein the light is ultraviolet ray.

4. The method of fabricating a liquid crystal display device according to claim 3, further comprising etching the lower substrate to expose a region of the attachment resin.

5. The method of fabricating a liquid crystal display device according to claim 1, further comprising forming an array pattern of thin film transistors by repetition of depositing and patterning the plurality of thin film layers.

6. The method of fabricating a liquid crystal display device according to claim 1, further comprising forming a color filter and a black matrix on the upper substrate.

7. The method of fabricating a liquid crystal display device according to claim 1, further comprising forming a screen frame having a penetration hole and formed under the upper and lower substrates.

8. The method of fabricating a liquid crystal display device according to claim 7, wherein the light is disposed under the screen frame.

9. The method of fabricating a liquid crystal display device according to claim 7, wherein the penetration hole is disposed to correspond with the attachment resin.

10. A method of fabricating a liquid crystal display device, comprising:
    preparing upper and lower substrates;
    forming a plurality of thin film layers on the lower substrate;
    forming a seal pattern on the plurality of thin film layers;
    forming an attachment resin at each of four corners of the lower substrate;
    forming a color filter and a black matrix on the upper substrate except for four corners;
    attaching the upper and lower substrates; and
    hardening the attachment resin with light from an outer side of the upper substrate.

11. The method of fabricating a liquid crystal display device according to claim 10, wherein the attachment resin is a light curable resin.

12. The method of fabricating a liquid crystal display device according to claim 10, wherein the light is ultraviolet ray.

13. The method of fabricating a liquid crystal display device according to claim 12, further comprising etching the lower substrate to expose a region of the attachment resin.

14. The method of fabricating a liquid crystal display device according to claim 10, further comprising forming an array pattern of thin film transistors by repetition of depositing and patterning the plurality of thin film layers.

15. The method of fabricating a liquid crystal display device according to claim 10, further comprising forming a screen frame having a penetration hole and formed under the upper and lower substrates.

16. The method of fabricating a liquid crystal display device according to claim 15, wherein the light is disposed under the screen frame.

17. The method of fabricating a liquid crystal display device according to claim 15, wherein the penetration hole is disposed to correspond with the attachment resin.

18. A method of fabricating a liquid crystal display comprising:
    a first mask process including:
        depositing and patterning a first metal layer on a lower substrate to form a gate electrode;
        sequentially depositing a first insulator, an intrinsic amorphous silicon layer, a doped amorphous silicon layer, and a second metal layer on the entire surface of the lower substrate;
    a second mask process including:
        patterning the second metal layer and the doped amorphous silicon layer to form drain lines, a source electrode, and a drain electrode;
        exposing the intrinsic amorphous silicon layer to form an active channel;
        depositing a second insulator on an entire surface of the lower substrate;
    a third mask process including:
        etching the second insulator, the second metal layer, the intrinsic amorphous silicon layer, and the first insulator corresponding to a pixel region;
        etching four corners of the lower substrate to form a plurality of attachment holes to expose the lower substrate;
        depositing a transparent conductive metal layer on the entire surface of the lower substrate to form a pixel electrode;
    a fourth mask process including:
        connecting the pixel electrode to the drain electrode.

19. The method of fabricating a liquid crystal display device according to claim 18, wherein the second insulator includes an organic material.

20. The method of fabricating a liquid crystal display device according to claim 18, wherein four layers including the second insulator, the second metal layer, the intrinsic amorphous silicon layer, and the first insulator are simultaneously etched by a dry etching method.

21. The method of fabricating a liquid crystal display device according to claim 20, wherein a residual photoresist and a region of the attachment hole are etched at the same rate and the same etch time as the four layers.

* * * * *